United States Patent [19]

Talvacchio et al.

[11] Patent Number: 5,162,294
[45] Date of Patent: Nov. 10, 1992

[54] BUFFER LAYER FOR COPPER OXIDE BASED SUPERCONDUCTOR GROWTH ON SAPPHIRE

[75] Inventors: John J. Talvacchio, Churchill Boro; Martin G. Forrester, Murrysville, both of Pa.

[73] Assignee: Westinghouse Electric Corp., Pittsburgh, Pa.

[21] Appl. No.: 662,088

[22] Filed: Feb. 28, 1991

[51] Int. Cl.$^5$ .......................... B32B 1/00; B05D 5/12
[52] U.S. Cl. ........................................ 505/1; 505/731; 505/701; 505/730; 427/62; 427/419.3; 427/419.3; 428/699; 428/701; 428/702; 204/192.24
[58] Field of Search .................. 505/1, 731, 701, 730; 427/62, 63, 419.3, 419.2; 428/699, 702, 701; 204/192.2 X

[56] References Cited

U.S. PATENT DOCUMENTS 3,912,612 10/1975 Gavaler et al. ...................... 204/192
4,043,888 8/1977 Gavaler .............................. 204/192 S
4,929,595 5/1990 Wu ....................................... 505/1
4,959,346 9/1990 Mogro-Campero et al. .......... 505/1

OTHER PUBLICATIONS

Witanachchi et al, "Effect of Buffer Layers on Low-Temperature Grown of Mirror-Like Superconducting Thin Films on Sapphire", Appl. Phys. Lett 55(3) Jul. 1989, pp. 295-297.
Stamper et al, "Sputter Deposition of $YBa_2Cu_3O_{6+x}$ on Alumina and the Influence of $ZrO_2$ Buffer Layers", Appl. Phys. Lett. 52(20) May 1988, pp. 1746-1748.
Yomo et al., *Japanese Jour. Appl. Physics*, vol. 26, No. 5, pp. L603-L605 (1987).
Gavaler & Talvacchio, *Physica B*. 155-156, pp. 1513-1514 (North Holland) 1990.
Eom et al., *Bull. Amer. Phys. Soc.* vol. 35 No. 3, p. 383, F17-6 (Abstract) Mar. 13, 1990.
Varadaraju et al., *Thin Solid Films*, vol. 164, pp. 119-121, 1988.
Talvacchio et al., *Physica C* (162-164), pp. 659-660 (North Holland), 1989.
Niato et al., *Jour. Mat. Res.* 2(6), pp. 113 to 725 (1987).
Char et al., *Appl. Phys. Lett.* 57(4), pp. 409 to 411 (1990).
Haldar et al., *Science*, vol. 241, Sep. 1988, pp. 1198 to 1200.

Primary Examiner—Michael Lusignan
Assistant Examiner—Roy V. King
Attorney, Agent, or Firm—Daniel P. Cillo

[57] ABSTRACT

A supported superconductor is made where a top layer of alkaline earth metal-copper oxide based material (10) is applied to a buffer layer (14) of $La_{2-x}Sr_xCuO_4$, where x is a value from 0 to 0.4, all of which is supported by a bottom layer (12) of $\alpha\text{-}Al_2O_3$.

10 Claims, 2 Drawing Sheets

BUFFER LAYER FOR COPPER OXIDE BASED SUPERCONDUCTOR GROWTH ON SAPPHIRE

The invention described herein was made in the performance of work under United States Air Force Contract F49620-88-C-0039, in which the government has rights.

BACKGROUND OF THE INVENTION

Thin film sputtering techniques have been used to deposit superconducting materials such as NbN and $Nb_3Ge$, as taught by U.S. Pat. No. 3,912,612 (Gavaler et al.) and U.S. Pat. No. 4,043,888 (Gavaler), respectively. More recently, many superconductor films having high critical temperature, $T_c$, values have been demonstrated, for example $(La_{0.9}Sr_{0.1})_2CuO_{4-y}$ with $T_c$ values around 37 K were reported by Yomo et al. in the *Japanese Jour. App. Physics*, "High Pressure Study and the Critical Current of High $T_c$ Superconductor $(La_{0.9}Sr_{0.1})_2CuO_{4-y}$", Vol. 26, No. 5, pp. L603–L605 (1987). The material $YBa_2Cu_3O_7$, due to its very high $T_c$ of 92 K, has most recently become a very important superconductor, and its deposition on $Y_2BaCuO_5$ in U.S. Pat. No. 4,929,595 (Wu), on $ZrO_2$ in U.S. Pat. No. 4,959,346 (Mogro-Campero), and its deposition on one of $SrTiO_3$, $LaAlO_3$, MgO, yttria stabilized $ZrO_2$, or $\alpha$-$Al_2O_3$ (sapphire) in Gavaler et al., *Physica B*, 165–166, "Optimization of $T_c$ and $J_c$ in Sputtered YBCO Films", pp 1513 to 1514 (North Holland), 1990, has been reported.

Off-axis sputtering of superconducting multi-layers of $YBa_2Cu_3O_7/La_{2-x}Sr_xCuO_4$ have also been very generally reported by Eom et al. in *Bull. Amer. Phys. Soc.* "Synthesis and Properties of $YBa_2Cu_3O_7/La_{2-x}Sr_xCuO_4$ Multilayered Superconducting Thin Films Grown In-Situ by Off Axis Sputtering", Vol. 35, No. 3, p. 383, F17-6 (Abstract) Mar. 13, 1990. A variety of bulk materials have been tried as a substrate material for $YBa_2Cu_3O_7$ films, where $YBa_2Cu_3O_7$ was screen printed on a polycrystalline ceramic sample to produce a film, as reported by Varadaraju et al., in *Thin Solid Films*, "Superconductivity Behaviour in Screen Printed $YBa_2Cu_3O_7$ Films", Vol. 164, pp 119 to 121, 1988. Alumina substrates were found most suitable, polycrystalline $La_2CuO_4$, $SrTiO_3$ and yttria stabilized zirconia substrates were found deficient, the latter three resulting in $T_c$ zero values of between 77 K to 80 K and either low resisitivity or insulating properties.

The best substrates for epitaxial growth of thin films of the high-temperature superconductor $YBa_2Cu_3O_7$ include single crystal $LaAlO_3$, and MgO. The low r.f. (radio frequency) surface resistance losses and lack of dispersion exhibited by $YBa_2Cu_3O_7$ superconductors make them attractive for use in filters, delay lines, stripline-resonators, directional couplers, and other passive devices in microwave systems. The (100) orientation of these substrates produces (001) growth of $YBa_2Cu_3O_7$, with, under the correct deposition conditions, high critical temperature and critical current density, and low microwave surface resistance. The disadvantage of these substrates for microwave applications is their high dielectric losses, and in some cases the lack of availability of large substrate sizes.

A more suitable substrate for microwave applications is sapphire ($\alpha$-$Al_2O_3$), which has very low dielectric losses, and is readily available in large areas. However, the quality of $YBa_2Cu_3O_7$ films grown directly on sapphire is inferior to films on high-loss substrates such as $LaAlO_3$, and MgO, since the $YBa_2Cu_3O_7$ film interacts with the sapphire at the elevated temperatures needed for formation of the high-$T_c$ phase, leading to a high-loss interface layer and poor film quality.

Talvacchio et al., in *Physica C*, 162–164, "$YBa_2Cu_3O_7$ Films Grown on Epitaxial MgO Buffer Layers on Sapphire", pp 659 to 660 (North Holland), 1989, taught use of epitaxial MgO as a buffer layer between a $YBa_2Cu_3O_7$ superconducting film and a sapphire substrate in passive microwave devices. A buffer layer of polycrystalline $ZrO_2$ between a $YBa_2Cu_3O_7$ film and a sapphire substrate was taught by Naito et al., in *Jour. Mat. Res.*, "Thin Film Synthesis of the High-$T_c$ Oxide Superconductor $YBa_2Cu_3O_7$ by Electron Beam Codeposition", 2 (6), pp 713 to 725, (1987). Also, a buffer layer of $SrTiO_3$ between a $YBa_2Cu_3O_7$ film and a sapphire substrate was taught by Char et al., in *Appl Phys. Lett.*, "Microwave Surface Resistance of Epitaxial $YBa_2Cu_3O_7$ Thin Films On Sapphire", 57(4), pp 409 to 411 (1990).

The use of MgO, $ZrO_2$ or $SrTiO_3$ as buffer layers, however, has still not provided an optimal $YBa_2Cu_3O_7$ combination with a sapphire support for microwave applications, where low rf surface resistance of the superconductor is essential. What is needed is a superconducting deposit on a sapphire substrate which will not exhibit reaction with sapphire and which will exhibit low rf surface resistance. It is one of the main objects of this invention to provide such a composite.

SUMMARY OF THE INVENTION

Accordingly, the invention resides in a supported superconductor, characterized by having a thin top layer of alkaline earth metal-copper oxide based material having a $T_c$ greater than 77° K.; a supporting substrate layer of $\alpha$-$Al_2O_3$; and a buffer layer of $La_{2-x}Sr_xCuO_4$, where x is a value from 0 to 0.4, having a thickness of from 0.004 micrometer to 2.0 micrometers disposed between and bonded to the top copper oxide layer and the $\alpha$-$Al_2O_3$ support substrate. Preferably, the copper oxide based material will be $YBa_2Cu_3O_7$ (1:2:3 ceramic oxide), and both of the other layers will be of single crystal structure.

The intermediate buffer layer $La_{2-x}Sr_xCuO_4$, preferably has a density of from 95% to 100% of theoretical, prevents Al migration from the substrate, and provides epitaxial growth of alkaline earth metal-copper oxide based material, such as $YBa_2Cu_3O_{7-x}$, to promote formation of a superconductor with a low rf surface resistivity. This buffer layer exhibits little or no interaction or interdiffusion with alkaline earth metal-copper oxide based material at the top copper oxide based material's deposition temperatures of from 500° C. to 900° C., so that no Al impurities pass through the buffer to the top layer.

The invention also resides in a method of forming a supported superconductor characterized by the steps of: (1) providing an $\alpha$-$Al_2O_3$ supporting substrate; (2) depositing a buffer layer of $La_{2-x}Sr_xCuO_4$, where x is a value from 0 to 0.4, having a thickness of from 0.004 micrometer to 2.0 micrometers, on a flat surface of the $\alpha$-$Al_2O_3$; and then (3) depositing, at from 500° C. to 900° C., a top layer of alkaline earth metal-copper oxide based material having a $T_c$ greater than 77 K, on top of the buffer layer, where the buffer layer prevents any substantial reaction of the top layer with the $\alpha$-$Al_2O_3$ upon deposition of the top layer, so that no Al impurities pass through the buffer layer to the top layer.

BRIEF DESCRIPTION OF THE DRAWING

In order that the invention can be more clearly understood, convenient embodiments thereof will now be described, by way of example, with reference to the accompanying drawings in which.

DESCRIPTION OF THE PREFERRED EMBODIMENTS

Figure 1:
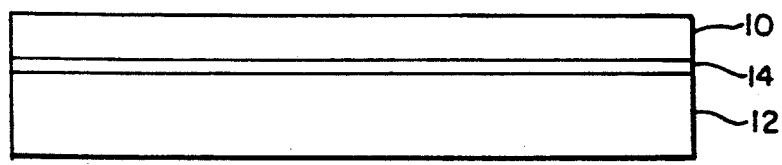
FIG. 1 is a cross-section view of the supported superconductor film, showing the intermediate buffer layer of this invention disposed on top of a substrate material.

Referring now to FIG. 1, a supported superconductor film is shown. The top superconducting layer 10 is an alkaline earth metal-copper oxide based ceramic selected from the group consisting of yttrium containing, alkaline earth metal-copper oxides, such as $YBa_2Cu_3O_7$; and rare earth containing, alkaline earth metal-copper oxides, such as $LaBa_2Cu_3O_7$ ceramics where the preferred rare earth elements are La, Nd, Sm, Eu, Gd, Dy, Ho, Er, and Yb; as well as bismuth-(Sr-Ca)-copper oxides, such as $Bi_2Sr_2Ca_{n-1}Cu_nO_z$ (n=2,3) ceramics; and thallium-(Ba-Ca) copper oxides, such as $Tl_xBa_2Ca_{n-1}Cu_nO_z$ (x=1,2; n=2,3) ceramics, where $Z=(3/2)\times+2n+2-\delta$, the latter two groups being described by Haldar et al., in *Science*, Vol. 241, September 1988, pp 1198 to 1200, for example, $Bi_2CaSr_2Cu_2O_{9-\delta}$. The most preferred materials are the 1:2:3 ceramics oxides, usually characterized as $YBa_2Cu_3O_7$. Alkaline earth metals include Mg, Ca, Sr, Ba and their mixtures.

All of these materials will have $T_c$ values greater than 77 K (the boiling point of liquid $N_2$) and can be deposited by various sputtering deposition techniques and the like, at temperatures of from 500° C. to 900° C. The bottom support substrate layer 12 will in all cases here be sapphire ($\alpha$-$Al_2O_3$), because of its outstandingly low dielectric loss and availability in large area single crystals. Preferably, the sapphire will be in single crystal form with the R-plane (also called the $\overline{1102}$ face) as the depositing surface, and will have a thickness of from 100 micrometers to 2 millimeters. However, as mentioned previously, if, for example $YBa_2Cu_3O_7$ is deposited directly on sapphire at about 600° C. to 660° C., Al from the sapphire will leach into the bottom of the forming film deposit and ruin the superconducting properties of all but very thick $YBa_2Cu_3O_7$ and similar copper oxide type films.

To control this, buffer layer 14 is, in this invention a thin film deposit of the superconducting material $La_{2-x}Sr_xCuO_4$, where x is a value from 0 to 0.4, preferably from 0 to 0.30. When x=0, the buffer layer is an insulator and its use as such can be particularly useful in the area of device fabrication with low rf losses. When x is greater than 0.4, an undesirable composite of multiple crystalline phases will form. This buffer layer 14 can have a thickness range of from 0.004 micrometer (40 Angstrom Units) to 2.0 micrometers, preferably from 0.01 micrometer to 0.5 micrometer. Over 2 micrometers, the buffer layer is unlikely to be smooth. Under 0.004 micrometer it will be difficult to deposit a very dense buffer layer and interaction between the top layer and the sapphire could occur. Preferably the buffer layer is from 95% to 100% of theoretical density, most preferably from 98% to 100% and is in single crystal form with a (001) growth orientation. In all cases it is much preferred to deposit buffer and top layer copper oxide as epitaxial layers in the c-axis (001) orientation on the ($\overline{1102}$) face of single crystal sapphire.

By stating that the buffer layer is deposited in the (001) orientation, it is meant that the c-axis of the crystal is perpendicular to the deposition ($\overline{1102}$) surface of the sapphire. By stating that the growth is epitaxial, it is meant that the crystal lattice of the film is aligned with the crystal lattice of the substrate in directions which lie in the plane of the film. Epitaxial, c-axis growth of the buffer layer allows similarly-oriented growth of the top superconducting layer resulting in advantages of high current density and low rf surface resistance in the top superconducting layer.

All of the materials previously described as suitable for the superconductor film 10 can be deposited on the buffer layer 14 at temperatures of from 500° C. to 900° C., and the buffer layer of this invention will be effective to substantially eliminate aluminum leaching into the top superconductor film. This buffer layer is sputter deposited on a flat surface of sapphire and then the alkaline earth metal-copper oxide based top layer is sputter deposited on top of the hot buffer layer at from 500° C. to 900° C. without any substantial reaction of the top layer with the sapphire. The usual method of deposition is rf or dc vacuum sputtering onto a heated substrate in an $A_r$-$O_2$ atmosphere, well known in the art, and taught for example in U.S. Pat. Nos. 3,912,612 and 4,043,888, herein incorporated by reference. Other high temperature superconducting film deposition techniques can also be used.

EXAMPLE

An epitaxial $La_{1.8}Sr_{0.2}CuO_4$ film buffer 0.04 micrometer (400 Angstrom Units) thick was deposited on the ($\overline{1102}$) face of a 2 inch diameter, single crystal $\alpha$-$Al_2O_3$ sapphire wafer at 650° C. followed, at approximately the same temperature by epitaxial deposition of a 0.1 micrometer (1000 Angstrom Units) thick top $YBa_2Cu_3O_7$ film on the buffer. Both the buffer and top film had a (001) c-axis orientation.

Both the $La_{1.8}Sr_{0.2}CuO_4$ buffer and $YBa_2Cu_3O_7$ top films were deposited by 90° off-axis dc magnetron sputtering from single, stoichiometric targets. The sputter gas was 150 mtorr Ar and 50 mtorr $O_2$. The deposition temperature for the buffer was 620° C. to 680° C. The $YBa_2Cu_3O_7$ top film was deposited at 680° to 720° C. The two-inch sapphire wafer was mounted on a 5.7 cm diameter circular substrate holder and the holder was rotated about its symmetry axis. Silver paint was used for both mechanical and thermal anchoring of the substrates whether a series of small sapphire chips or a single large sapphire wafer was used. The distance from the center of the substrate holder to the axis of the targets was 5.8 cm. After final deposition, the chamber was filled to 20 torr $O_2$ and the samples were first cooled to 400° C. for a 15 to 20 min period and then to room temperature.

Figure 2:
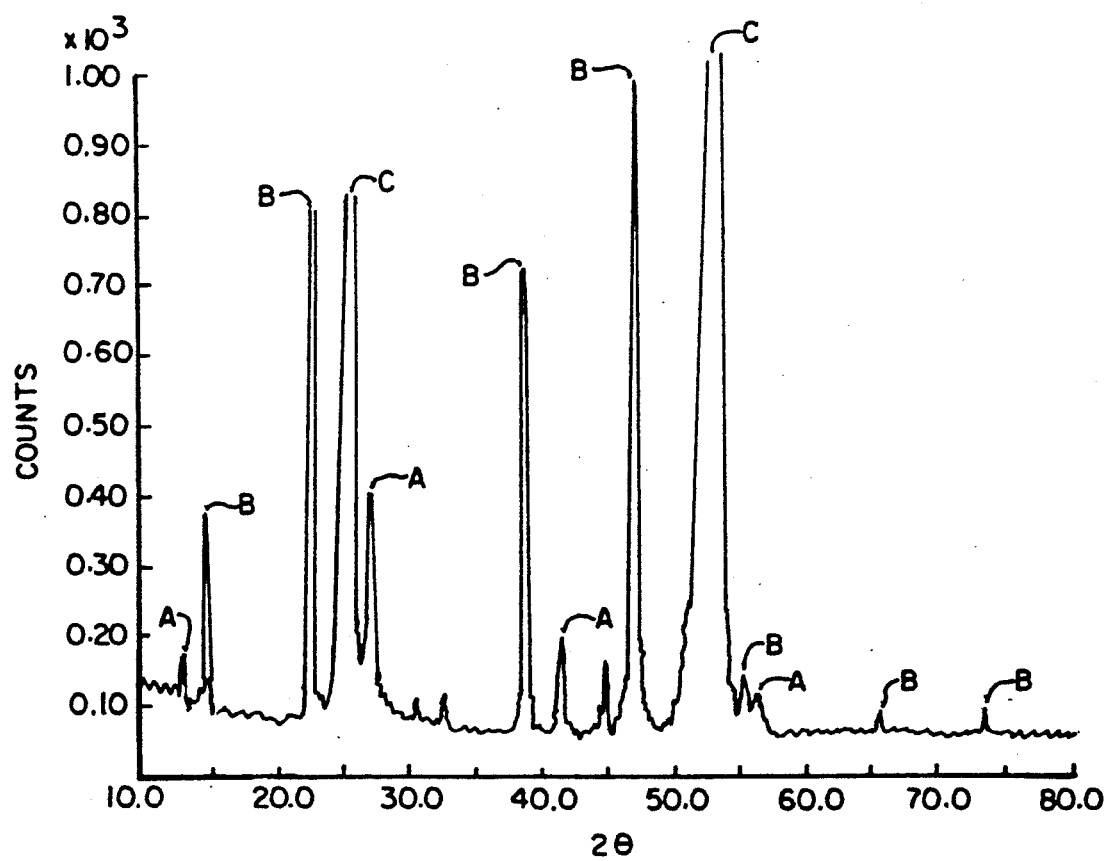
FIG. 2 is an x-ray diffraction curve for 0.1 micrometer $YBa_2Cu_3O_7$ film grown on a 0.04 micrometer $La_{1.8}Sr_{0.2}CuO_4$ buffer on $\alpha$-$Al_2O_3$ (sapphire)
Figure 3:
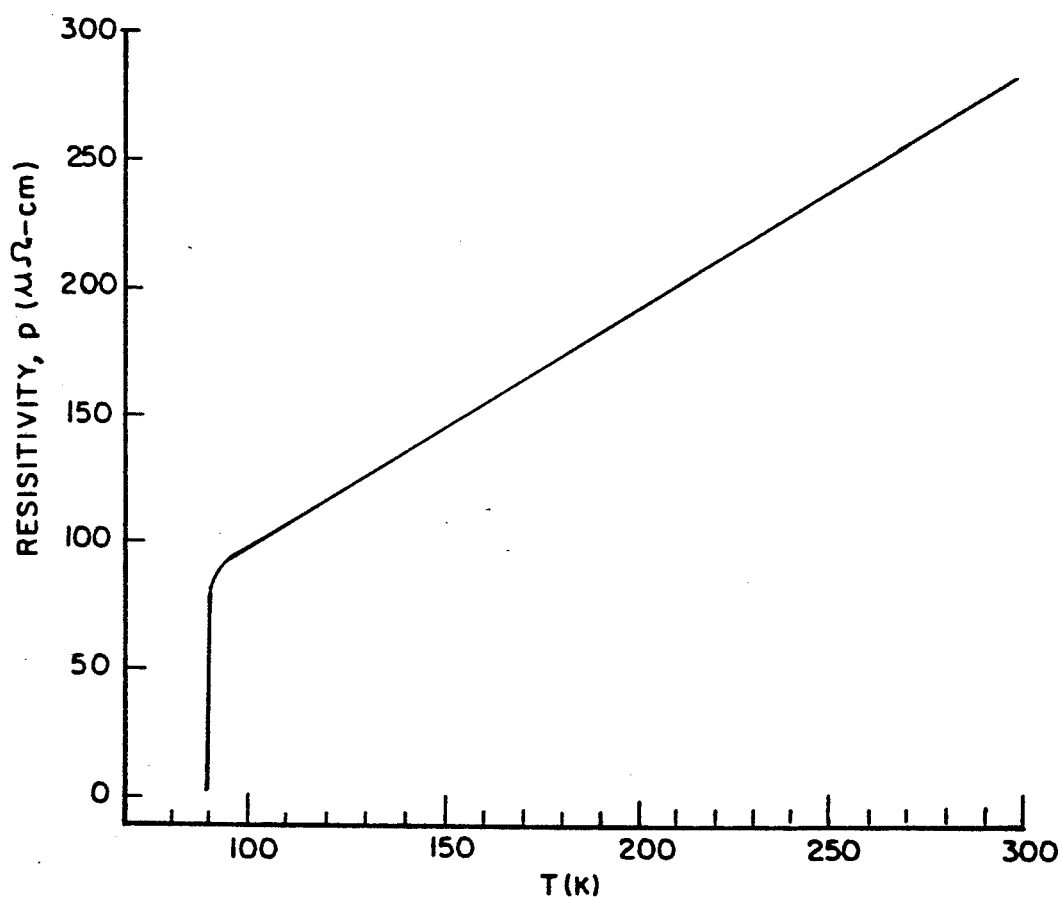
FIG. 3 is a graph of resistivity and superconducting transition for $YBa_2Cu_3O_7$ on sapphire with a central buffer layer of $La_{1.8}Sr_{0.2}CuO_4$.

FIG. 2 shows x-ray diffraction data for the 0.1 micron $YBa_2Cu_3O_7$ film grown on 0.04 micrometer $La_{1.8}Sr_{0.2}CuO_4$ buffer on a sapphire substrate, and shows the desirable c-axis growth typical of a high quality $YBa_2Cu_3O_{7-x}$ superconducting film. In FIG. 2, A peaks = $La_{1.8}Sr_{0.2}CuO_4$ (00n) where n=2,4,6,8; B peaks = $YBa_2Cu_3O_7$ (00n) where n=2 to 9; and c = sapphire peaks from the $(\bar{1}102)$ face of sapphire. FIG. 3 shows the resistivity and resistively measured superconducting transition for the same sample. The resistive transition temperature is as high as any reported in the literature for a film on sapphire and, for a 0.1 micrometer film, shows no Al diffusion to the $YBa_2Cu_3O_7$. Also, by keeping the buffer layer thin, its dielectric loss at rf can be made negligible.

Films of $La_{2-x}Sr_xCuO_4$ can be deposited by any of the standard high temperature superconductor film deposition techniques, including off-axis dc magnetron sputtering and laser ablation, and thus does not require special provisions for incorporation into device fabrication. In addition, film patterning is not affected by the presence of the buffer layer since $La_{2-x}Sr_xCuO_4$ can be etched using the same etchant as $YBa_2Cu_3O_7$.

The Sr content, x, of the film may be varied to control the conductivity, and thus the rf skin depth, of the film. Ideally one would like to minimize the Sr content to maximize the resistivity, and thus the skin depth.

An advantage of a $La_{2-x}Sr_xCuO_4$ buffer layer over $SrTiO_3$, one of the two most successful buffer layers demonstrated in the literature, is that $La_{2-x}Sr_xCuO_4$ microwave losses decrease with decreasing temperature, while the loss tangent of $SrTiO_3$ is very large and diverges as temperature decreases below about 170 K. An advantage of $La_{2-x}Sr_xCuO_4$ over MgO, the other successful buffer layer, is that $La_{2-x}Sr_xCuO_4$ has a perovskite structure as do the alkaline earth metal-copper oxide based top layers and MgO does not.

We claim:

1. A supported superconductor, comprising a thin top layer of alkaline earth metal-copper oxide based material having a $T_c$ greater than 77 K; a supporting substrate layer of $\alpha$-$Al_2O_3$; and a buffer layer of $La_{2-x}Sr_xCuO_4$, where x is a value from 0 to 0.4, having a thickness of from 0.004 micrometer to 2.0 micrometers and a density of from 95% to 100% of theoretical density, disposed between and bonded to the top copper oxide layer and the supporting substrate, where the buffer layer prevents Al migration from the substrate layer so that the top layer contains no Al impurities.

2. The supported superconductor of claim 1, where the alkaline earth metal-copper oxide based material is selected from the group consisting of yttrium-alkaline earth metal-copper oxide, rare earth metal-alkaline earth metal-copper oxide, bismuth-(Sr-Ca)-copper oxide, and thallium-(Ba-Ca)-copper oxide, where alkaline earth metal is selected from the group consisting of Mg, Ca, Sr, Ba and their mixtures, where the buffer layer exhibits little or no interaction or interdiffusion with the top layer and where rare earth metal is selected from the group consisting of La, Nd, Sm, Eu, Gd, Dy, Ho, Er and Yb.

3. The supported superconductor of claim 1, where the alkaline earth metal-copper oxide based material is $YBa_2Cu_3O_7$; and where the buffer layer is a single crystal of $La_{2-x}Sr_xCuO_4$ where x is a value from 0 to 0.30, having a thickness of from 0.01 micrometer to 0.5 micrometer.

4. The supported superconductor of claim 1, where the support is single crystal $\alpha$-$Al_2O_3$ having a thickness of from 100 micrometers to 2 millimeters.

5. The supported superconductor of claim 1, where the alkaline earth metal-copper oxide based top layer contains no Al impurities and the top layer and the buffer layer have (001) orientation and the buffer layer is deposited on the $(\bar{1}102)$ face of single crystal sapphire.

6. The supported superconductor of claim 1, where the top layer of alkaline earth metal-copper oxide based material and the buffer layer are both epitaxial layers.

7. A method of forming a supported superconductor comprising the steps: (1) providing an $\alpha$-$Al_2O_3$ supporting substrate; and then (2) depositing a buffer layer of $La_{2-x}Sr_xCuO_4$, where x is a value from 0 to 0.4, having a thickness of from 0.004 micrometer to 2.0 micrometers and a density of from 95% to 100% of theoretical density, on a flat surface of the $\alpha$-$Al_2O_3$; and then (3) depositing, at from 500° C. to 900° C., a top layer of alkaline earth metal-copper oxide based material having a $T_c$ greater than 77 K, on top of the buffer layer, where the buffer layer exhibits little interaction with the copper oxide based material and prevents any substantial reaction of the top layer with the $\alpha$-$Al_2O_3$ upon deposition of the top layer, so that no Al impurities pass through the buffer layer to the top layer so that the top layer contains no Al impurities.

8. The method of claim 7, where the deposition in steps (2) and (3) are by high temperature sputtering, the alkaline earth metal-copper oxide based material is selected from the group consisting of yttrium-alkaline earth metal-copper oxide, rare earth metal-alkaline earth metal-copper oxide, bismuth-(Sr-Ca)-copper oxide, and thallium-(Ba-Ca)-copper oxide, where alkaline earth metal is selected from the group consisting of Mg, Ca, Sr, Ba and their mixtures, and rare earth metal is selected from the group consisting of La, Nd, Sm, Eu, Gd, Dy, Ho, Er and Yb.

9. The supported film of claim 7, where the alkaline earth metal-copper oxide based material is $YBa_2Cu_3O_7$ where the buffer layer is a single crystal $La_{2-x}Sr_xCuO_4$ where x is a value from 0 to 0.30 having a thickness of from 0.01 micrometer to 0.5 micrometer, where both the top layer and buffer layer are epitaxially grown and where the top layer and buffer layer are grown with (001) orientation and the buffer layer is deposited on the $(\bar{1}102)$ face of single crystal sapphire.

10. A supported superconductor film made by the method of claim 7.

* * * * *